United States Patent
Madoglio et al.

(10) Patent No.: US 9,438,265 B2
(45) Date of Patent: Sep. 6, 2016

(54) PHASE MULTIPLEXER

(71) Applicant: Intel Corporation, Santa Clara, CA (US)

(72) Inventors: Paolo Madoglio, Beaverton, OR (US); Stefano Pellerano, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/155,327

(22) Filed: Jan. 14, 2014

(65) Prior Publication Data

US 2015/0303939 A1 Oct. 22, 2015

(51) Int. Cl.

| G06F 1/04 | (2006.01) |
|---|---|
| H03M 1/82 | (2006.01) |
| G06F 1/08 | (2006.01) |
| H03M 1/08 | (2006.01) |
| H03M 1/66 | (2006.01) |
| H03K 5/13 | (2014.01) |
| H03L 7/16 | (2006.01) |
| H03K 5/00 | (2006.01) |

(52) U.S. Cl.
CPC .............. *H03M 1/822* (2013.01); *G06F 1/08* (2013.01); *H03K 5/131* (2013.01); *H03M 1/0836* (2013.01); *H03M 1/662* (2013.01); *G06F 1/04* (2013.01); *H03K 2005/00045* (2013.01); *H03L 7/16* (2013.01)

(58) Field of Classification Search
CPC ............ H03L 2207/50; H03L 7/0991; H03L 7/1976; H03L 7/07; H03L 7/081; H03L 7/093; H03L 7/18; H03L 7/1974; H03L 7/0814; H03L 7/089; H03L 7/091; H03L 7/0994; H03L 7/107
USPC ........ 341/153, 156, 159, 276; 327/156, 159, 327/276
See application file for complete search history.

(56) References Cited

U.S. PATENT DOCUMENTS

| 6,259,318 | B1 * | 7/2001 | Mielke | H03F 1/3223 330/129 |
|---|---|---|---|---|
| 6,690,219 | B2 * | 2/2004 | Chuang | H03L 7/16 327/176 |
| 6,826,247 | B1 * | 11/2004 | Elliott | G09G 5/008 327/150 |
| 7,973,578 | B2 * | 7/2011 | Oh | G04F 10/005 327/149 |
| 8,085,074 | B1 * | 12/2011 | Janardhanan | H03L 7/10 327/149 |
| 8,339,295 | B2 * | 12/2012 | Nagaraj | H03B 21/02 327/105 |
| 2009/0028274 | A1 * | 1/2009 | Kim | G04F 10/06 375/340 |
| 2012/0268184 | A1 * | 10/2012 | Baumann | H03K 5/135 327/277 |
| 2012/0288044 | A1 * | 11/2012 | Roberts | H03L 7/00 375/350 |
| 2014/0062552 | A1 * | 3/2014 | Choi | H03L 7/08 327/158 |
| 2014/0266822 | A1 * | 9/2014 | Henzler | G04F 10/005 341/118 |

* cited by examiner

*Primary Examiner* — Linh Nguyen
(74) *Attorney, Agent, or Firm* — Schwegman Lundberg & Woessner, P.A.

(57) ABSTRACT

Representative implementations of devices and techniques provide a phase multiplexer that may be associated with at least a communication device. The described phase multiplexer may be able to switch between input phases without distorting a pulse width of a given input phase. In one implementation, this is achieved by enabling one phase at a time. More specifically, a gating window specific for each given phase is provided. The gating window is designed to avoid glitches associated with signals at an output of the phase multiplexer. Furthermore, the gating window is designed to avoid the generation of pulse width modifications.

17 Claims, 5 Drawing Sheets

PHASE MULTIPLEXER

BACKGROUND

A digital to time converter (DTC) is an electrical circuit that translates a digital bit stream into an outgoing waveform. Typical DTCs, for example, convert a digital bit stream of logical "1"s and "0"s into an outgoing waveform such that the frequency and/or phase of the waveform varies in time to mirror the bit-pattern of the incoming digital bit stream.

A building block of a DTC is the phase multiplexer. The phase multiplexer is used to select dynamically between input phases (e.g. produced by phase locked loops "PLLs") according to the modulation and without introducing glitches. Moreover, the phase multiplexer must be able to unwrap the phase (producing an output waveform that may have a delay larger than 1 clock period compared to the input unmodulated clock). The unwrapping is necessary to mimic the PLL behavior as a frequency modulator, and to ensure low out of band noise in the transmit output spectrum. The phase multiplexer achieves phase unwrapping by being able to cyclically select phases based within a period of the input clock.

Conventional phase multiplexers have relatively complicated architectures. Such complicated architectures are required because conventional phase multiplexers generally must change the selection for the phase twice every local oscillator period (e.g., 200 ps @2.5 GHz, or even a shorter time in presence of phase modulation). Furthermore, the architectures are complicated because it is known that conventional phase multiplexers create duty cycle modulation that requires correction by otherwise superfluous circuitry or functionality.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Representative implementations of devices and techniques provide a phase multiplexer that may be associated with, for example, at least a communication device. The described phase multiplexer may be able to switch between input phases without distorting a pulse width of a given input phase. In one implementation, this is achieved by enabling one phase at a time. More specifically, a gating window specific for each given phase is provided. The gating window is designed to avoid glitches associated with signals at an output of the phase multiplexer. Furthermore, the gating window is designed to avoid the generation of pulse width modifications.

Various implementations, including techniques and devices, are discussed with reference to the figures. The techniques and devices discussed may be applied to any of various network designs, circuits, and devices and remain within the scope of the disclosure.

Implementations are explained in more detail below using a plurality of examples. Although various implementations and examples are discussed here and below, further implementations and examples may be possible by combining the features and elements of individual implementations and examples.

Example Implementations

Figure 1:
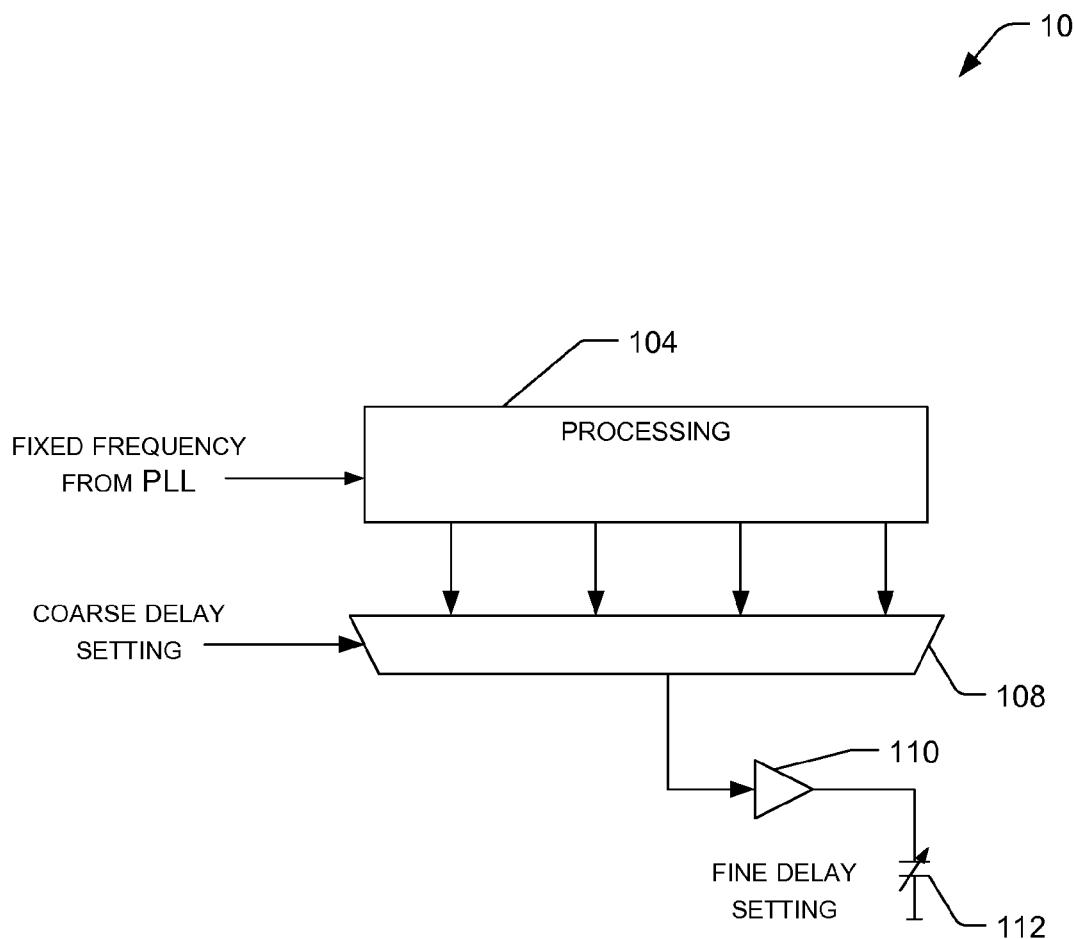
FIG. 1 is a schematic diagram of an example digital to time converter (DTC).

FIG. 1 is a schematic diagram of an example digital to time converter (DTC) 100, wherein the techniques and devices disclosed herein may be applied, according to an implementation.

In general, the DTC 100 produces a desired time delay to an input frequency (e.g., "fixed frequency from phase locked loop (PLL)"). In other words, the DTC 100 delays incoming signal edges according to tuning information at its input. In various implementations, the input frequency may be supplied by a digital locked loop (DLL), or the like. However, in general, generic frequency synthesizer may be used to apply the input frequency.

The input frequency may be split into a plurality of phases by a processing element 104. In one implementation, the input frequency is processed by the processing element 104, which has a functionality of a series of delay elements, to provide the plurality of phases. In another implementation, the input frequency is processed by the processing element 104, which has the functionality of a divider, to provide equally spaced phases across one period of a clock frequency.

In an implementation, each delay element of the processing element 104 adds a predetermined amount of delay time (e.g., 100 ps, etc.) to the input frequency. Accordingly, a desired coarse delay duration may be produced by accumulating a quantity of delay times from the one or more delay associated with the processing element 104 (e.g., passing through three delay elements may result in 3×100 ps=300 ps of time delay, etc.). In one example, the delay elements of the processing element 104 are a fixed delay interval from each other.

In an implementation, the plurality of phase is provided by the processing element 104 are received by a phase multiplexer 108, described in greater detail hereinafter. In one implementation, the DTC 100 includes a fine delay stage 110 having a finer delay increment (e.g., 2 ps, 5 ps, 10 ps, etc.) than the coarse delay interval provided by the processing element 104. This second stage may include an independent delay element 112 with fine tuning capability, used to interpolate in between the coarse phases. In other words, the fine delay intervals may interpolate between each of the coarse delay intervals. In alternate implementations, an example DTC 100 may include fewer, additional, or alternate components.

In an alternate implementation of the DTC 100, instead of the delay elements, the processing element 104 provides divider functionality. In this alternative implementation of the DTC 100, the processing element 104 is a divider by N divider. Therefore, the processing element 104 operates to provide 2N equally spaced phases across one period of a target clock frequency seen at the output of the DTC 100. The approach of the alternate implementation of the DTC 100 element eliminates the requirement to have the delay functionality associated with the processing element 104.

The arrangement illustrated in FIG. 1 may be modified. For example, as indicated in the foregoing, the processing element 104 may have divider functionality that provides a plurality of phases to the phase multiplexer 108. Alternatively, the phase multiplexer 108 may receive a plurality of phases from a DLL. In yet another example, a combination of a divider, the phase multiplexer and a DLL provide a property of phases to the phase multiplexer 108.

Figure 2:
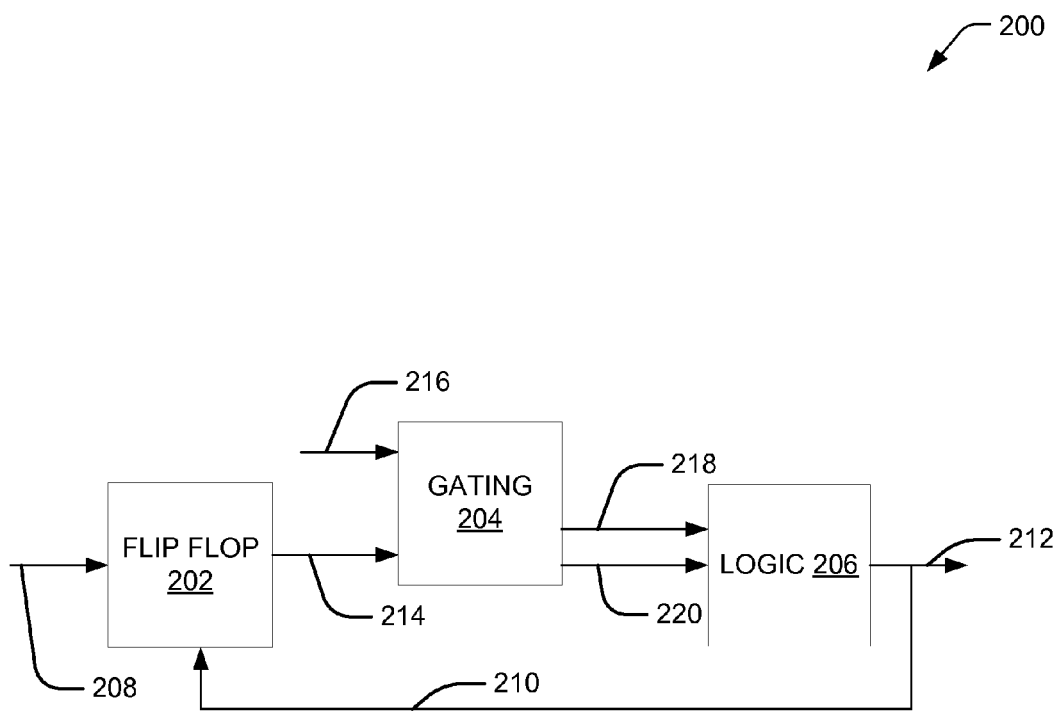
FIG. 2 illustrates an implementation of a phase multiplexer.

FIG. 2 illustrates an implementation of a phase multiplexer 200. The phase multiplexer 200 may be used in the place of the phase multiplexer 108 illustrated in FIG. 1. However, the phase multiplexer 200 may also be used in other implementations. For example, the phase multiplexer 200 may be used in a general communication device. Alternatively, the phase multiplexer 200 may be used in microprocessors, data conversion implementations, and other implementations that that may benefit from the use of digital frequency signals.

The phase multiplexer 200 is implemented generally with three functional elements. The three functional elements include a flip-flop element 202, a gating element 204 and a logic element 206. The flip-flop element 202 has an input 208. The flip-flop element 202 is triggered at an input 210. Triggering the flip-flop element 202 is achieved by way of a signal, such as a clock signal, at an output 212 of the phase multiplexer 200. The flip-flop 202 has an output 214 that is coupled to an input of the gating element 204. The gating element 204 has a further input 216. The gating element 204 has two outputs, output 218 and output 220. The output 218 and 220 are coupled to the logic element 206.

The flip-flop 202 is to receive a digital word (phi_word [1:0]) on the input 208. The digital word received on input 208 is triggered to be output by the flip-flop 202 by the frequency signal received on the input 210. The triggered digital word (e.g., a first digital word, a second digital word, and so on) output by the flip-flop 202 is provided to the gating element 204 on the output 214. The digital word output by the flip-flop 202 is used by the gating element 204 to enable selection of one of a plurality of phases (input phases [1:0]) that is available on the input 216 and being processed by individual elements of the gating element 204. In this example, the plurality of phases includes a first phase (phase [0]) and a second phase (phase [1]). However, in general, any plurality of phases may be available on the input 216 and processed by the gating element 204.

The gating element 204 provides the plurality of phases, each one of the plurality of phases on a respective one of the output 218 and 220, to the logic element 206. In one example, the logic element 206 is an OR gate. However, the logic element 206 may also be implemented as a NAND gates or NOR gates configured to function as an OR gate. The logic element 206 provides an output on the output 212 in accordance with the gated phase signals received on outputs 218 and 220.

Figure 3:
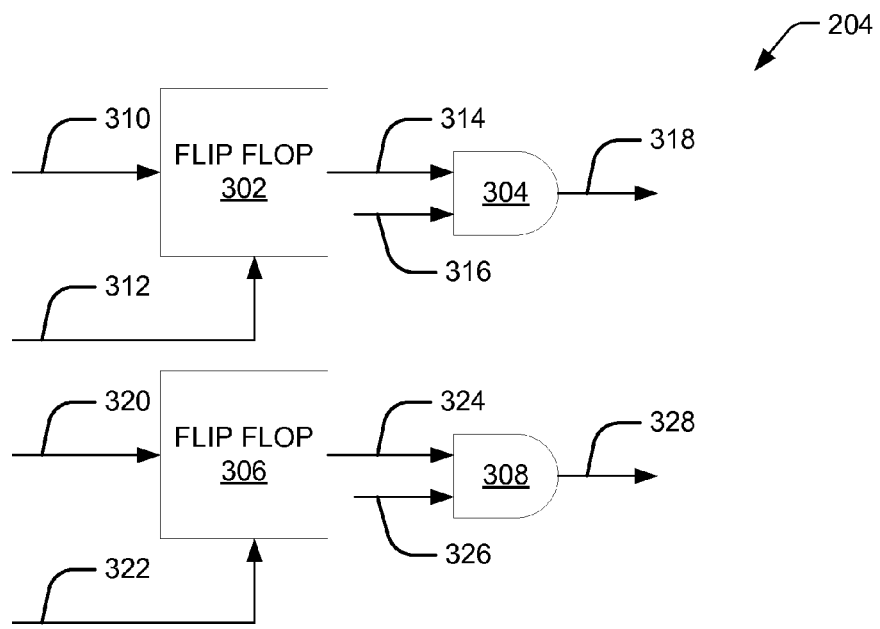
FIG. 3 illustrates an implementation of the gating element illustrated in FIG. 1.

FIG. 3 illustrates an implementation of the gating element 204 illustrated in FIG. 1. In this example, the gating element 204 is designed to receive and process two input phases (input phases [1:0]). However, a greater number of input phases may also be processed by the gating element 204. In that case, additional flip-flop and AND gate combinations would be provided in the gating element 204.

The gating element 204 may include a flip-flop 302 and an AND gate 304. The combination of the flip-flop 302 and the AND gate 304 are provided to process a first input phase (input phase [0]) during a unique gating window. The combination of the flip-flop 306 and the AND gate 308 are provided to process a second input phase (input phase [1]) during a unique gating window. More specifically, the gating element 204 processes each received phase in a unique gating window. That is, the gating element 204 processes one of the received phases, then processes another of the received phases, and so on.

The flip-flop 302 is functional to receive on a first input 310 a first digital word (phi_word_synch [0]) triggered by the flip-flop 202. Furthermore, the flip-flop 302 is functional to receive on a second input 312 the second input phase (input phase [1]), which is used to trigger the flip-flop 302. Once triggered, the flip-flop 302 provides a first enable signal (en [0]) on the output 314. The enable signal provided on the output 314 is fed to the AND gate 304. The AND gate 304 also receives the first input phase (input phase [0]) on an input 316. The AND gate 304 provides a first phase gated output (ph_gated [0]) when both the first enable signal and first input phase are at a high logic level. The first phase gated output is provided on the output 318. As an alternative to the foregoing, the same phase (e.g., input phase [0]) received on the input 316 may also be provided to the second input 312, in place of the second input phase (input phase [1]).

The flip-flop 306 is functional to receive on a first input 320 a second digital word (phi_word_synch [1]) triggered by the flip-flop 202. Furthermore, the flip-flop 306 is functional to receive on a second input 322 the first input phase (input phase [0]), which is used to trigger the flip-flop 306. Once triggered, the flip-flop 306 provides a second enable signal (en [1]) on the output 324. The enable signal provided on the output 324 is fed to the AND gate 308. The AND gate 308 also receives the second input phase (input phase [1]) on an input 326. The AND gate 308 provides a second phase gated output (ph_gated [1]) when both the second enable signal and second input phase are at a high logic level. The second phase gated output is provided on the output 328. As an alternative to the foregoing, the same phase (e.g., input phase [1]) received on the input 326 may also be provided to the second input 322, in place of the first input phase (input phase [0]).

Figure 4:
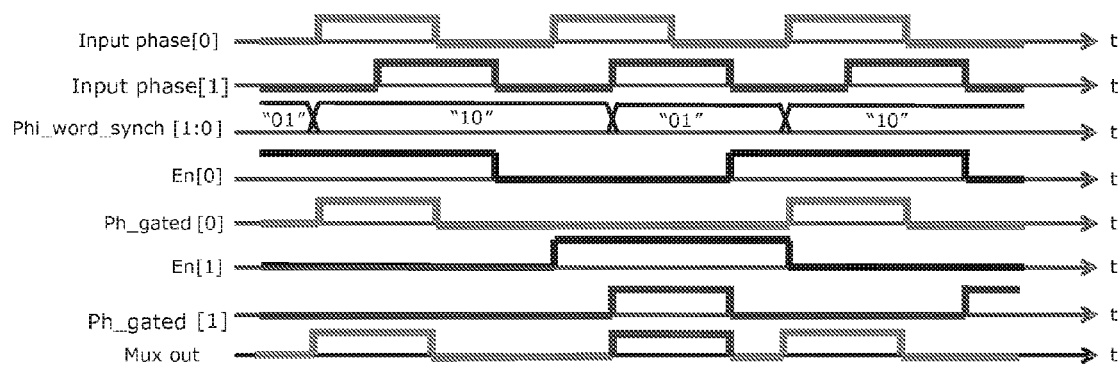
FIG. 4 illustrates waveforms associated with the implementations illustrated in FIGS. 1-3.

FIG. 4 illustrates waveforms associated with the implementations illustrated in FIGS. 1-3. The illustrated waveforms relate to the gating process for two input phases (input phase [1:0]). However, as previously indicated, phase multiplexer 200 may be expanded to process N phases, where N is an integer value.

As illustrated in FIG. 4, the input phase [0] signal is initially selected from a previous cycle. The input phase [0] signal is processed by the gating element 204 (i.e., the flip-flop 302 and the AND gate 304) and the logic element 206; This provides an output of the phase gated [0] signal at the output 318 and also on the output 212. (mux out) The latter is fed back to the flip-flop 202, which causes the flip-flop 202 to trigger and provide the transition "0→1" on the signal phi_word_synch [1]. This causes the flip-flop 306 to output the en [1] signal at a logic level high, once triggered by the input phase [0] signal. Therefore, the AND gate 308 receives a logic level high on both its inputs 324 (en [1]) and 326 (input phase [1]). This provides an output of the phase gated [1] signal at the output 328 and also on the output 212. The output signal 212 is fed back to the flip-flop 202, which causes the flip-flop 202 to trigger and provide the transition "0→1" on the signal phi_word_synch [0]. This causes the flip-flop 302 to output en [0] signal at a logic level high, once triggered by the input phase [1] signal. Therefore, the AND gate 304 receives a logic level high on both its inputs 314 (en [0]) and 316 (input phase [0]). This provides an output of the phase gated [0] signal at the output 318 and also on the output 212. The output of the phase gated [0] signal is fed back to the flip-flop 202, which causes the flip-flop 202 to trigger and provide the digital word signal.

Representative Computing Device

Figure 5:
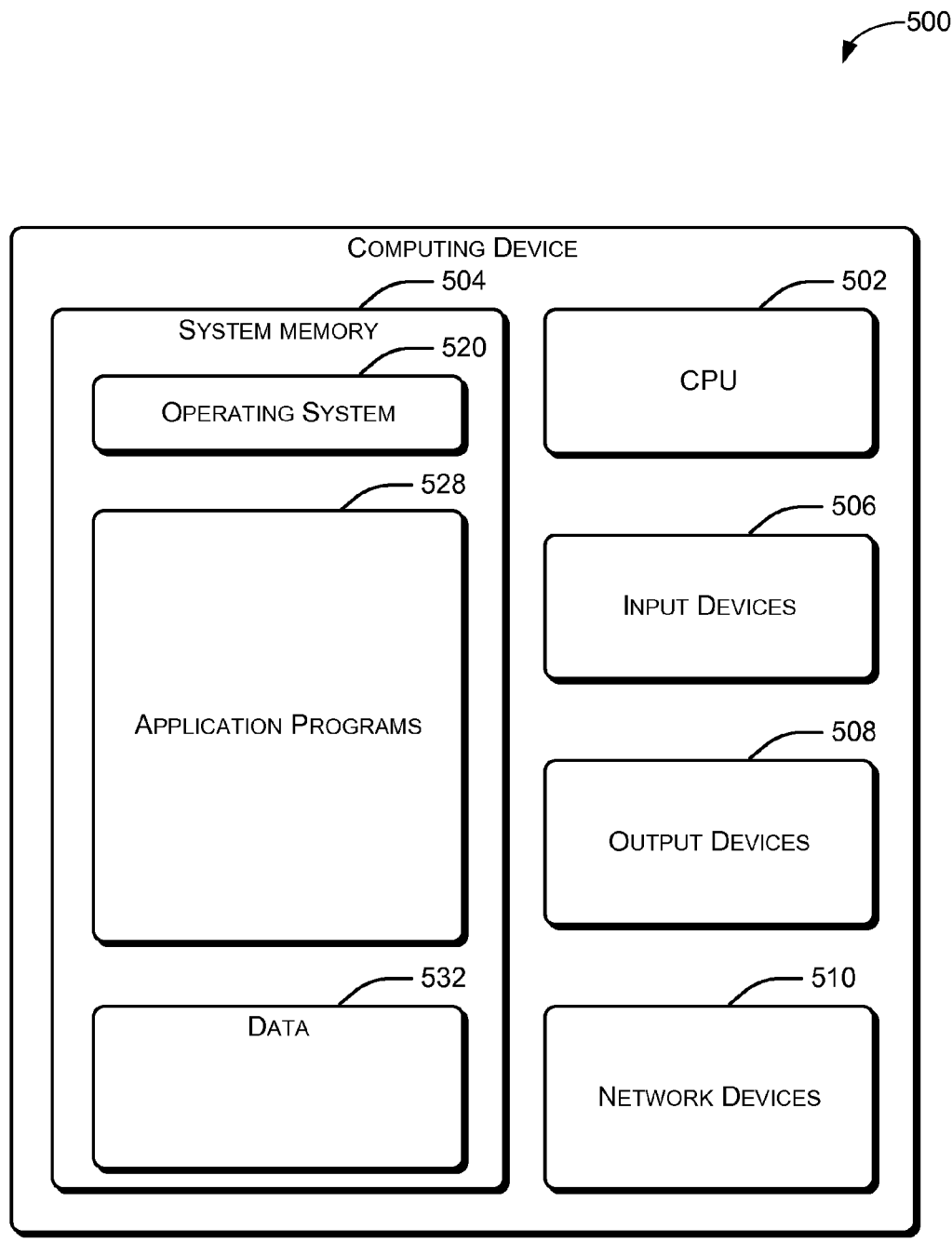
FIG. 5 illustrates an example computing device within which the described implementations may be either fully or partially implemented.

FIG. 5 illustrates an example computing device 500 within which the described implementations may be either fully or partially implemented. Computing device 500 is only one example of a computing system and is not intended to suggest any limitation as to the scope of the use or functionality of the invention.

Computing device 500 can be implemented with numerous other general purpose or special purpose computing system environments or configurations. Examples of well known computing systems, environments, and/or configurations that may be suitable for use include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, gaming consoles, distributed computing environments that include any of the above systems or devices, and the like.

The components of computing device 500 can include, but are not limited to, processor 502 (e.g., any of microprocessors, controllers, and the like), system memory 504, input devices 506, output devices 508, and network devices 510. The network devices 510 may include a first and second network device interfaces. For example the first network device may be a wireless device interface and the second network device may be a wireline device interface. In one example, the DTC 100 is associated with at least one of the first and second network device interfaces of the network devices 510. In a particular example, the wireless device interface provides a radio Frequency (RF) signal that is phase-shifted to obtain a phase-shifted RF signal. The RF signal is then down converted to obtain an Intermediate Frequency (IF) signal and the phase-shifted RF signal is downconverted to obtain a phase-shifted IF signal. Further, a time delay between the IF signal and the phase-shifted IF signal is estimated. Subsequently, the phase-shifted RF signal is processed using the time delay in order to obtain a more accurate phase shift in the phase-shifted RF signal. The DTC 100 may be used to obtain a more accurate phase-shifted RF signal, in one example.

Computing device 500 typically includes a variety of computer-readable media. Such media can be any available media that is accessible by computing device 500 and includes both volatile and non-volatile media, removable and non-removable media. System memory 504 includes tangible computer-readable media in the form of volatile memory, such as random access memory (RAM), and/or non-volatile memory, such as read only memory (ROM). A basic input/output system (BIOS), containing the basic routines that help to transfer information between elements within computing device 500, such as during start-up, is stored in system memory 504. System memory 504 typically contains data and/or program modules that are immediately accessible to and/or presently operated on by processor 502. Elements described in this disclosure may be implemented as computer instructions and stored in the system memory 504. Such computer instructions may be executed by the processor 502 to provide functionality associated with the computer instructions. Furthermore, elements described in this disclosure may be implemented as hardware circuitry, or a combination of computer instructions in hardware circuitry.

System memory 504 can also include other removable/non removable, volatile/non-volatile computer storage media. By way of example, a hard disk drive may be included for reading from and writing to a non-removable, non-volatile magnetic media; a magnetic disk drive may be included for reading from and writing to a removable, non-volatile magnetic disk (e.g., a "floppy disk"); and an optical disk drive may be included for reading from and/or writing to a removable, non-volatile optical disk such as a CD ROM, DVD, or any other type of optical media.

The disk drives and their associated tangible computer-readable media provide non volatile storage of computer-readable instructions, data structures, program modules, and other data for computing device 500. It is to be appreciated that other types of computer readable media which can store data that is accessible by computing device 400, such as magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like, can also be utilized to implement exemplary computing device 500. Any number of program modules can be stored in system memory 504, including by way of example, an operating system 520, application programs 528, and data 532.

Computing device 500 can include a variety of computer readable media identified as communication media. Communication media typically embodies computer readable instructions, data structures, program modules, or other data in a modulated data signal such as a carrier wave or other transport mechanism and includes any information delivery media. The term "modulated data signal" refers to a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

A user can enter commands and information into computing device 500 via input devices 506 such as a keyboard and a pointing device (e.g., a "mouse"). Other input devices 506 may include a microphone, joystick, game pad, controller, satellite dish, serial port, scanner, touch screen, touch pads, key pads, and/or the like. Output devices 508 may include a CRT monitor, LCD screen, speakers, printers, and the like.

Computing device 500 may include network devices 510 for connecting to computer networks, such as local area network (LAN), wide area network (WAN), and the like.

Figure 6:
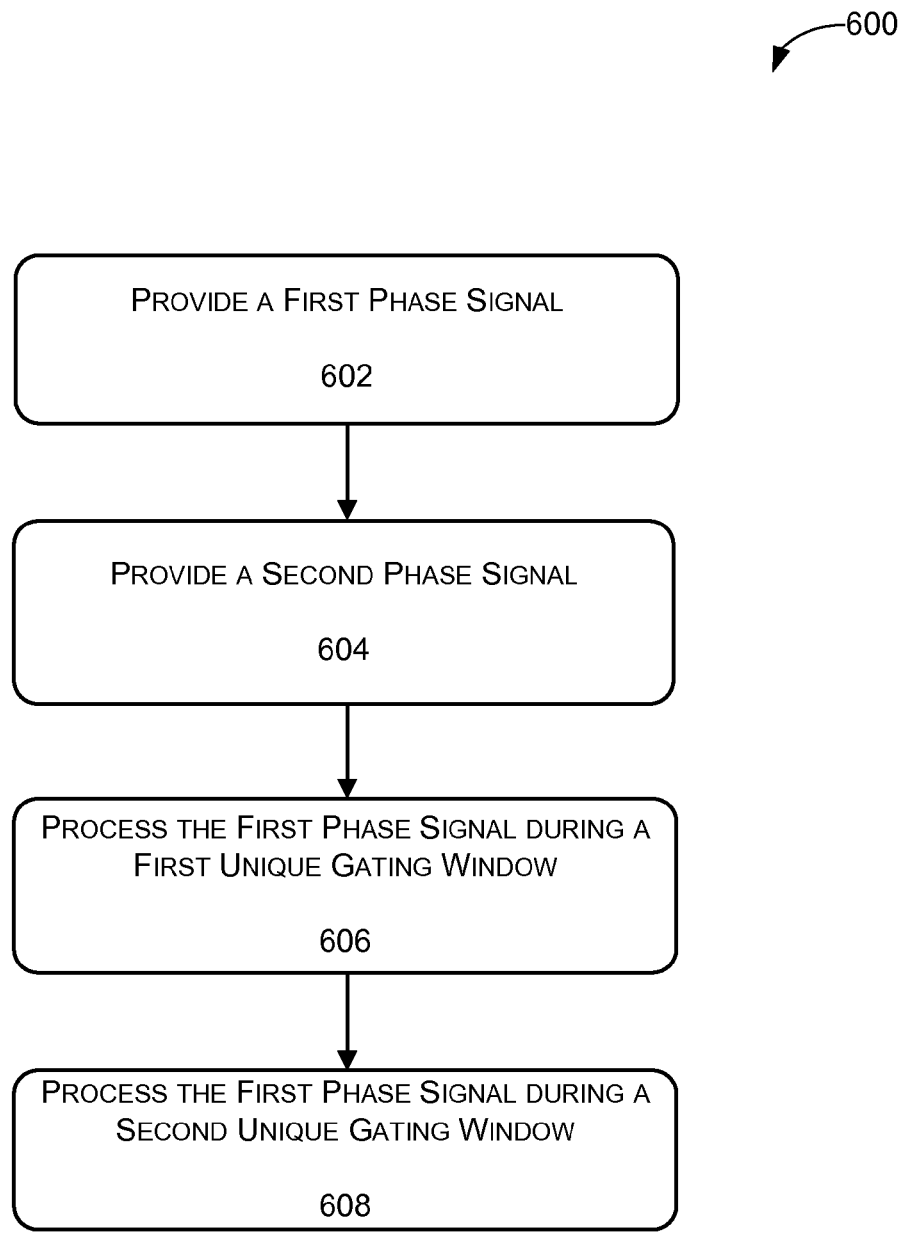
FIG. 6 shows a processing flow that may be associated with one or more embodiments of the described DTC, phase multiplexer and/or computing device.

FIG. 6 shows a processing flow that may be associated with one or more embodiments of the described DTC 100, phase multiplexer 200 and/or computing device 500.

Example processing flow 600 may include one or more operations, actions, or functions as illustrated by one or more of blocks. Although illustrated as discrete blocks, various blocks may be divided into additional blocks, combined into fewer blocks, or eliminated, depending on the desired implementation. Further, in accordance with one or more embodiments, the processing flow 600 may be implemented by the described DTC 100, phase multiplexer 200 and/or computing device 500. Processing flow 600 may begin at block 602.

At block 602, a first phase signal is provided. In one implementation, the first phase signal is received at the input 216 of the gating element 204, processed by the gating element 204 and provided at an output 218 or 220 of the gating element 204.

At block 604, a second phase signal is provided. In one implementation, the second phase signal is received at the input 216 of the gating element 204, and processed by the gating element 204 and provided at an output 218 or 220 of the gating element 204.

More than two phase signals may be provided and processed by the processing flow 600.

At block 606, the first phase signal is processed during a first unique gating window. In one implementation, the combination of the flip-flop 302 and the AND gate 304 provides the processing of the first phase signal during the first unique gating window. The flip-flop 302 is functional to receive on the first input 310 a first digital word. Furthermore, the flip-flop 302 is functional to receive on the second input 312 the second input phase, which is used to trigger the flip-flop 302. Once triggered, the flip-flop 302 provides a first enable signal on the output 314. The enable signal provided on the output 314 is fed to the AND gate 304. The AND gate 304 also receives the first input phase on the input 316. The AND gate 304 provides a first phase gated output when both the first enable signal and first input phase are at a high logic level. The first phase gated output is provided on the output 318. As an alternative to the foregoing, the same phase signal (e.g., the first phase signal) received on the input 316 may also be provided to the second input 312, in place of the second input phase signal.

At block 608, the second phase signal is processed during a second unique gating window, which is different than the first unique gating window. In one implementation, the combination of the flip-flop 306 and the AND gate 308 provides the processing of the second phase signal during the second unique gating window. The flip-flop 306 is functional to receive on the first input 320 a second digital word. Furthermore, the flip-flop 306 is functional to receive on a second input 322 the first input phase signal, which is used to trigger the flip-flop 306. Once triggered, the flip-flop 306 provides a second enable signal on the output 324. The enable signal provided on the output 324 is fed to the AND gate 308. The AND gate 308 also receives the second input phase on the input 326. The AND gate 308 provides a second phase gated output when both the second enable signal and second input phase are at a high logic level. The second phase gated output is provided on the output 328. As an alternative to the foregoing, the same phase (e.g., the second phase signal) received on the input 326 may also be provided to the second input 322, in place of the first input phase.

In alternate implementations, one or more of the above techniques may be employed concurrently, or another technique may be used to accomplish the same or similar results. The implementations herein are described in terms of exemplary embodiments. However, it should be appreciated that individual aspects of the implantations may be separately claimed and one or more of the features of the various embodiments may be combined.

The arrangements, procedures and protocols of the described implementations may be implemented on a special purpose computer, a programmed microprocessor or microcontroller and peripheral integrated circuit element(s), an ASIC or other integrated circuit, a digital signal processor, a flashable device, a hard-wired electronic or logic circuit such as discrete element circuit, a programmable logic device such as PLD, PLA, FPGA, PAL, a transmitter/receiver, any comparable device, or the like. In general, any apparatus capable of implementing a state machine that is in turn capable of implementing the methodology described and illustrated herein may be used to implement the various communication methods, protocols and techniques according to the implementations.

A digital to time converter, may include a processing element to provide a plurality of phase signals; a multiplexer circuit coupled to the processing element, the multiplexer circuit to receive the plurality of phase signals, the multiplexer circuit to process a first signal of the plurality of phase signals during a first gating window and the multiplexer circuit to process a second signal of the plurality of phase signals during a second gating window, the first and second gating windows being unique.

The digital to time converter according to the foregoing, wherein the processing element comprises a plurality of the delay elements, each of the plurality of delay elements providing a phase of the plurality of phases.

The digital to time converter according to the foregoing, wherein the processing element comprises a divider element to provide the plurality of phases spaced across one period of a frequency signal.

The digital to time converter according to the foregoing, wherein the multiplexer circuit comprises a first flip-flop coupled to a first logic element, the first flip-flop and the first logic element to provide the first gating window to process the first signal of the plurality of phase signals.

The digital to time converter according to the foregoing, wherein the multiplexer circuit further comprises a second flip-flop coupled to a second logic element, the second flip-flop and a second logic element to provide the second gating window to process the second signal of the plurality of phase signals.

The digital to time converter according to the foregoing, wherein the first logic element is a first AND gate and the second logic element is a second AND gate.

The digital to time converter according to the foregoing, wherein the first flip-flop includes a first and second input, the first input to receive a digital word and the second input to receive the first signal of the plurality of phase signals, the first flip-flop further including an output to provide an enable signal to a first input associated with the first logic element, the first logic element further to receive the first signal of the plurality of phase signals on a second input associated with the first logic element.

The digital to time converter according to the foregoing, wherein the first flip-flop includes a first and second input, the first input to receive a digital word and the second input to receive the first signal of the plurality of phase signals, the first flip-flop further including an output to provide an enable signal to a first input associated with the first logic element, the first logic element further to receive the second signal of the plurality of phase signals on a second input associated with the first logic element.

The digital to time converter according to the foregoing, wherein the second flip-flop includes a first and second input, the first input to receive a digital word and the second input to receive the second signal of the plurality of phase signals, the second flip-flop further including an output to provide an enable signal to a first input associated with the second logic element, the second logic element further to receive the second signal of the plurality of phase signals on a second input associated with the second logic element.

The digital to time converter according to the foregoing, wherein the second flip-flop includes a first and second input, the first input to receive a digital word and the second input to receive the second signal of the plurality of phase signals, the second flip-flop further including an output to provide an enable signal to a first input associated with the second logic element, the second logic element further to receive the first signal of the plurality of phase signals on a second input associated with the second logic element.

In another implementation, a device, such as a digital to time converter, may include a multiplexer circuit to receive a plurality of phase signals, the multiplexer circuit including a first plurality of circuit elements to process a first phase signal of the plurality of phase signals and a second plurality of circuit elements to process a second phase signal of the plurality of phase signals.

The digital to time converter according to the foregoing another implementation, wherein the first plurality of circuit elements processes the first phase signal over a first time period and the second plurality of circuit elements processes the second phase signal over a second time period, the first time period being at least partly different than the second time period.

The digital to time converter according to the foregoing another implementation, The digital to time converter according to the foregoing another implementation, wherein the first plurality of circuit elements comprises a flip-flop coupled to an input of an AND gate.

The digital to time converter according to the foregoing another implementation, wherein the second plurality of circuit elements comprises a flip-flop coupled to an input of an AND gate.

The digital to time converter according to the foregoing another implementation, wherein the multiplexer circuit further includes a flip-flop that is coupled to the first plurality of circuit elements and further coupled to the second plurality of circuit elements, the flip-flop to provide a first digital word to the first product circuit elements and provide a second digital word to the second plurality of circuit elements.

The digital to time converter according to the foregoing another implementation, wherein the flip-flop is triggered by a frequency signal provided at an output of the multiplexer circuit.

The digital to time converter according to the foregoing another implementation, wherein the multiplexer circuit further includes a logic element coupled to a first output of the first plurality of circuit elements and further coupled to a second output of the second plurality of circuit elements, the logic element to receive the first phase signal from the first plurality of circuit elements and to receive the second phase signal from the second plurality of circuit elements.

The digital to time converter according to the foregoing another implementation, wherein the logic element is an OR gate.

A computer implemented method may include providing a plurality of phase signals; processing a first signal of the plurality of phase signals during a first unique gating window; processing a second signal of the plurality of phase signals during a second unique gating window.

The computer implemented method according to the foregoing may further include wherein the computer implemented method is executed by a digital to time converter.

The disclosed procedures may be readily implemented in software using object or object-oriented software development environments that provide portable source code that can be used on a variety of computer or workstation platforms. Alternatively, the disclosed arrangements may be implemented partially or fully in hardware using standard logic circuits or VLSI design. The communication arrangements, procedures and protocols described and illustrated herein may be readily implemented in hardware and/or software using any known or later developed systems or structures, devices and/or software by those of ordinary skill in the applicable art from the functional description provided herein and with a general basic knowledge of the computer and telecommunications arts.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing the invention.

What is claimed is:

1. A digital to time converter, comprising:
   a processing element to provide a plurality of phase signals;
   a multiplexer circuit coupled to the processing element and including an input flip-flop element, the multiplexer circuit configured to receive the plurality of phase signals, to receive digital time information at the input flip-flop element, and to process a first signal of the plurality of phase signals during a first gating window and a second signal of the plurality of phase signals during a second gating window using one or more digital words provided by the input flip-flop element;
   wherein the first and second gating windows are unique from one another; and
   wherein an output of the multiplexer is configured to trigger the input flip-flop element.

2. The digital to time converter according to claim 1, wherein the processing element comprises a plurality of the delay elements, each of the plurality of delay elements providing a phase of the plurality of phases.

3. The digital to time converter according to claim 1, wherein the processing element comprises a divider element to provide the plurality of phases spaced across a single period of a frequency signal.

4. The digital to time converter according to claim 1, wherein the multiplexer circuit comprises a first flip-flop coupled to a first logic element, the first flip-flop and the first logic element configured to provide the first gating window to process the first signal of the plurality of phase signals.

5. The digital time converter according to claim 4, wherein the multiplexer circuit further comprises a second flip-flop coupled to a second logic element, the second flip-flop and a second logic element configured to provide the second gating window to process the second signal of the plurality of phase signals.

6. The digital time converter according to claim 5, wherein the first logic element is a first AND gate and the second logic element is a second AND gate.

7. The digital time converter according to claim 4, wherein the first flip-flop includes a first and second input, the first input to receive a digital word of the one or more digital words and the second input to receive the first signal of the plurality of phase signals, the first flip-flop further including an output to provide an enable signal to a first input associated with the first logic element, the first logic element further to receive the first signal of the plurality of phase signals on a second input associated with the first logic element.

8. The digital time converter according to claim 4, wherein the first flip-flop includes a first and second input, the first input to receive a digital word of the one or more digital words and the second input to receive the first signal of the plurality of phase signals, the first flip-flop further including an output to provide an enable signal to a first input associated with the first logic element, the first logic element further to receive the second signal of the plurality of phase signals on a second input associated with the first logic element.

9. The digital tune converter according to claim 5, wherein the second flip-flop includes a first and second input, the first input to receive a digital word of the one or more digital words and the second input to receive the second signal of the plurality of phase signals, the second flip-flop further including an output to provide an enable signal to a first input associated with the second logic element, the second logic element further to receive the second signal of the plurality of phase signals on a second input associated with the second logic element.

10. The digital time converter according to claim 5, wherein the second flip-flop includes a first and second input, the first input to receive a digital word of the one or more digital words and the second input to receive the second signal of the plurality of phase signals, the second flip-flop further including an output to provide an enable signal to a first input associated with the second logic element, the second logic element further to receive the first signal of the plurality of phase signals on a second input associated with the second logic element.

11. A device, comprising:
a multiplexer circuit to receive a plurality of phase signals, the multiplexer circuit including:
a first plurality of circuit elements to process a first phase signal of the plurality of phase signals;
a second plurality of circuit elements to process a second phase signal of the plurality of phase signals; and
a flip-flop that is coupled to the first plurality of circuit elements and further coupled to the second plurality of circuit elements the flip-flop to provide a first digital word to the first product circuit elements and provide a second digital word to the second plurality of circuit elements;
wherein the flip-flop is triggered by a frequency signal provided at an output of the multiplexer circuit.

12. The device according to claim 11, wherein the first plurality of circuit elements processes the first phase signal over a first time period and the second plurality of circuit elements processes the second phase signal over a second time period, the first time period being at least partly different from the second time period.

13. The device according to claim 11, wherein the first plurality of circuit elements comprises a flip-flop coupled to an input of an AND gate.

14. The device according to claim 11, wherein the second plurality of circuit elements comprises a flip-flop coupled to an input of an AND gate.

15. The device according to claim 11, wherein the multiplexer circuit further includes a logic element coupled to a first output of the first plurality of circuit elements and further coupled to a second output of the second plurality of circuit elements, the logic element to receive the first phase signal from the first plurality of circuit elements and to receive the second phase signal from the second plurality of circuit elements.

16. The device according to claim 15, wherein the logic element is an OR gate.

17. The device according to claim 11, wherein the device is a digital to time converter.

* * * * *

UNITED STATES PATENT AND TRADEMARK OFFICE
CERTIFICATE OF CORRECTION

PATENT NO. : 9,438,265 B2
APPLICATION NO. : 14/155327
DATED : September 6, 2016
INVENTOR(S) : Madoglio et al.

Page 1 of 1

It is certified that error appears in the above-identified patent and that said Letters Patent is hereby corrected as shown below:

In the Claims

In Column 11, Line 15, in Claim 9, delete "tune" and insert --time--, therefor

In Column 12, Line 8, in Claim 11, delete "elements" and insert --elements,--, therefor Signed and Sealed this
Second Day of July, 2019

Andrei Iancu
*Director of the United States Patent and Trademark Office*